United States Patent [19]

Bendell

[11] Patent Number: 4,551,760
[45] Date of Patent: Nov. 5, 1985

[54] TELEVISION CAMERA WITH SOLID-STATE IMAGERS COOLED BY A THERMAL SERVO

[75] Inventor: Sidney L. Bendell, Burlington, N.J.

[73] Assignee: RCA Corporation, Princeton, N.J.

[21] Appl. No.: 532,958

[22] Filed: Sep. 16, 1983

[51] Int. Cl.$^4$ .................. H04N 3/15; H04N 9/04; H04N 9/07; H04N 9/09
[52] U.S. Cl. .................. 358/213; 358/41; 358/43; 358/44; 358/50
[58] Field of Search .............. 358/41, 43, 44, 50, 358/213

[56] References Cited

U.S. PATENT DOCUMENTS

| | | | |
|---|---|---|---|
| 3,126,498 | 3/1964 | Bendell | 358/217 |
| 4,405,961 | 9/1983 | Chow et al. | 360/129 |

FOREIGN PATENT DOCUMENTS

| | | | |
|---|---|---|---|
| 79400182.6 | 3/1979 | European Pat. Off. | |
| 54-139423 | 10/1979 | Japan | 358/44 |
| 1355975 | 6/1974 | United Kingdom. | |
| 1523232 | 8/1978 | United Kingdom. | |
| 2019009 | 10/1979 | United Kingdom. | |

OTHER PUBLICATIONS

Article "Designing Low-Current Thermoelectric Coolers" by Jepson et al., published in book Tunnel-Diode & Semiconductor Circuits edited by Carroll, published by McGraw-Hill, 1961.
Article "Thermoelectric Modules MF-10 Universal Active Filter" by Forrest Mims—published in Computers & Electronics Magazine (date unknown).

Primary Examiner—Michael A. Masinick
Assistant Examiner—Randall S. Svihla
Attorney, Agent, or Firm—Eugene M. Whitacre; William H. Meise; Lawrence C. Edelman

[57] ABSTRACT

A color television camera includes a plurality of solid-state imagers each of which is responsive to different spectral components. A thermal servo senses the temperature of an imager and controls its temperature so as to control thermally generated noise. The temperature sensor may be integral with the chip and further may be a component ordinarily used for other purposes. The other imagers may be uncooled or may be cooled in an open-loop fashion under the control of the thermal servo.

4 Claims, 7 Drawing Figures

TELEVISION CAMERA WITH SOLID-STATE IMAGERS COOLED BY A THERMAL SERVO

This invention relates to a camera including a solid-state imager which is cooled for low dark current, and for best noise performance and which avoids condensation on the cooled surface.

Portable television cameras having solid-state imagers have begun to appear on the marketplace. These cameras are very advantageous in that they are extremely rugged and have no inherent degradation mechanisms. They do have certain disadvantages when compared with conventional vidicon tubes, among which are low resolution, which arises from the discrete sensing sites on the photosensitive surface, and also the generation of unwanted noise due to mechanisms unique to solid-state imagers. These noise mechanisms include temperature-dependent black-level leakage currents which appear as signal even in the absence of light. The problem of noise due to temperature-dependent sources is exacerbated by the power dissipated in the imager and support circuitry during operation, which may cause a temperature rise of 30° C. above the ambient air temperatures.

It is very desirable to cool the imagers to reduce the temperature-sensitive noise. It has been found that cooling of the imager to about $+10°$ C. provides satisfactory operation. The cooling may be accomplished by thermoelectric coolers, which are solid-state devices through which current is passed in order to pump thermal energy away from a cooled surface. Attempts to cool a solid-state imager exposed to the atmosphere resulted in condensation of moisture onto the surface of the imager under conditions of high humidity, resulting in degradation of performance. Further attempts to cool the imager included placing the imager in a housing containing dry gas and a window for allowing light from the image to fall onto the imager and for retaining the gas. This, however, resulted in cooling of the window and the condensation problem was transferred from the imager to the window.

It is desirable to cool the solid-state imager of a camera for reduced noise and low dark current without creating a problem of condensation.

SUMMARY OF THE INVENTION

A color television camera includes a plurality of solid-state imagers each of which is responsive to different spectral components. A thermal servo senses the temperature of an imager and controls its temperature. The temperature sensor may be integral with the chip and further may be a component ordinarily used for other purposes. The other imagers may be uncooled or may be cooled in an open-loop fashion under the control of the thermal servo.

DESCRIPTION OF THE INVENTION

Figure 1:
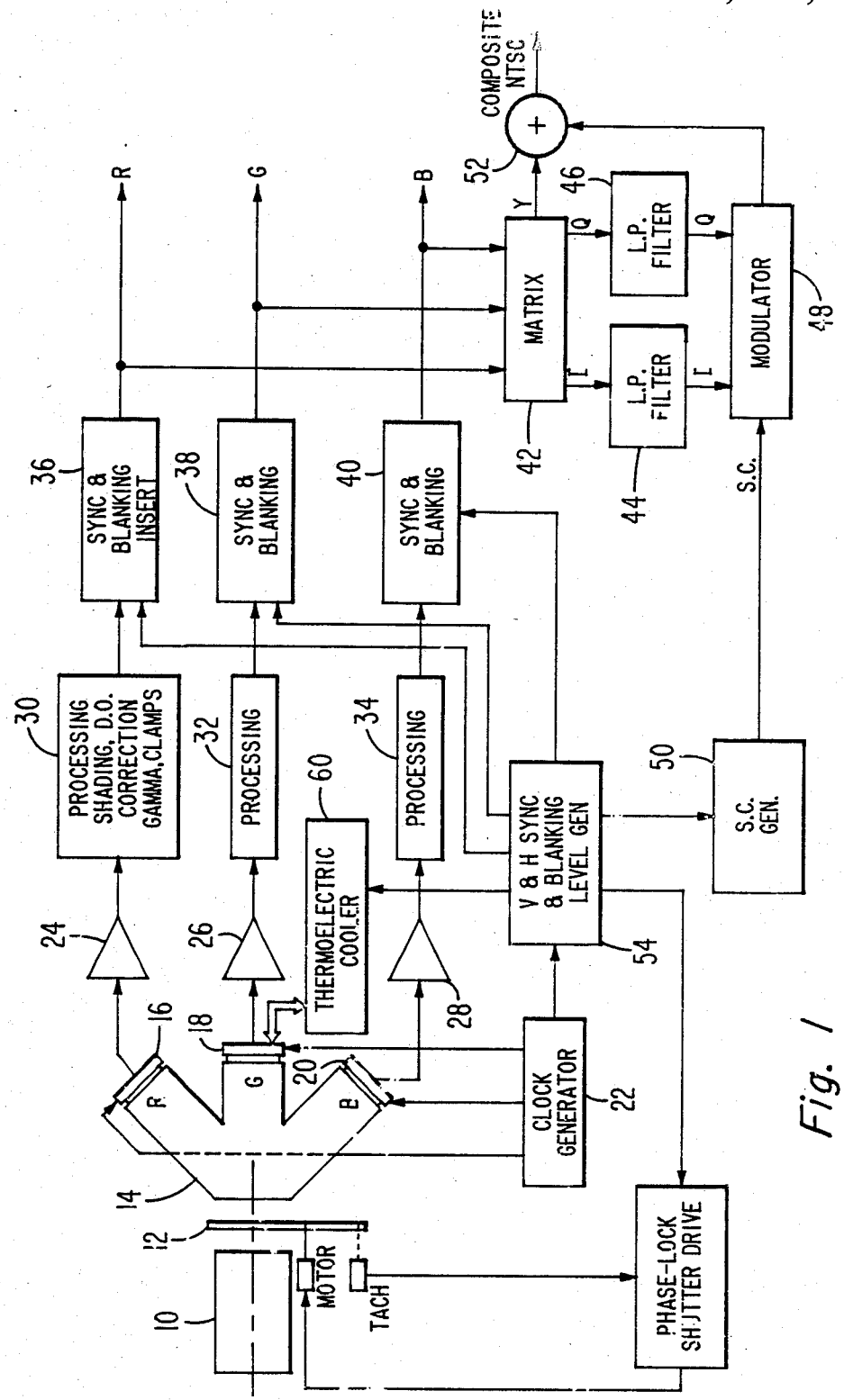
FIG. 1 is a block diagram of a color television camera.

In FIG. 1, a lens 10 focusses light from an image (not shown) past a rotating shutter 12 to a color-splitting prism 14 which divides the light according to its color and applies it to a red (R) imager 16, a green (G) imager 18 and a blue (B) imager 20. Imagers 16, 18 and 20 are of the field-transfer type. A clock generator illustrated as a block 22 provides multiphase clock signals for control of the pull-down and signal transfer of the imagers. Signal preamplifiers 24, 26, and 28 are coupled to the R, G and B imagers respectively for amplifying the signals therefrom and for applying them to processing circuits illustrated as blocks 30, 32 and 34, respectively. The processing includes ordinary camera signal processing which may include shading, dropout (DO) correction, gamma correction, clamping and the like. The process signals are applied to circuits designated as 36–40 for insertion of sync and blanking to produce R, G and B baseband video signals for application to utilization circuits (not shown).

The R, G and B signals are also applied to a matrix 42 which generates Y, I and Q signals in known fashion. The I and Q signals are applied through low-pass filters 44 and 46, respectively, to a modulator illustrated as a block 48 for modulation in known fashion onto a subcarrier received from a subcarrier generator 50. The color signal modulated onto the subcarrier is summed with the Y signal in an adder 52 to form a composite color television signal. The Y, I, and Q signals may be applied directly to a portable videotape recorder without passing through the modulator.

In accordance with an aspect of the invention, a thermoelectric cooler and its associated circuitry illustrated together as a block 60 is thermally and electrically coupled to green imager 18.

Figure 2:
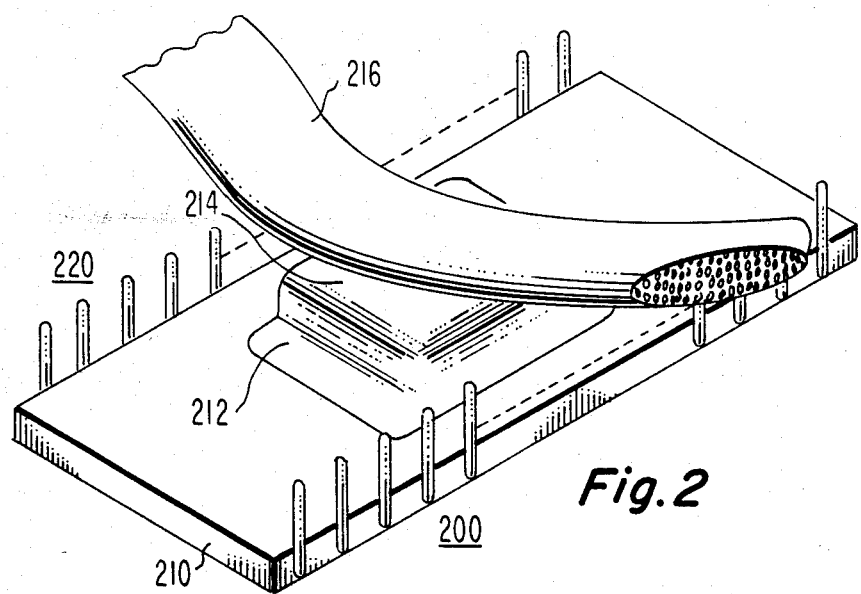
FIG. 2 is a perspective view of a mount for the imager according to the invention.

FIG. 2 illustrates in perspective view the structure 200 of the mount for imager 18. A plastic or ceramic base material 210 supports the imager (not visible in FIG. 2). A thermoelectric cooler (also not visible) lies under thermally conductive cap 212 for pumping heat from the imager towards top portion 214 of cap 212. A thermally conductive braid material such as copper braid 216 is thermally affixed to the top 214 of cap 212 to aid in carrying heat away from the cap to a thermal heat sink (not shown). The imager is formed as an integrated circuit chip which is too delicate for ordinary electrical connections. An array of electrical contact pins designated generally as 220 has connections to the imager and provides convenient electrical connection to a socket. Braid 216 may be oriented so as to reduce interference with the socket connection.

Figure 3:
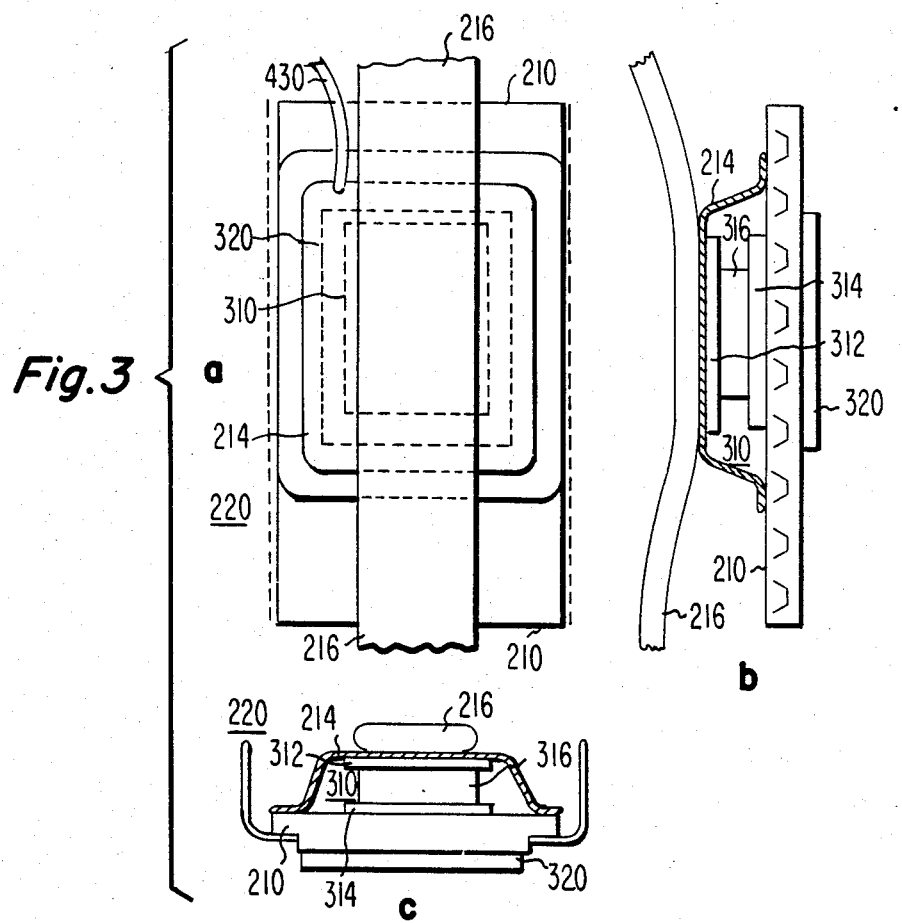
FIGS. 3, 4 and 5 are various cut-away views illustrating the mounting of the imager.

FIG. 3 illustrates the structure 200 in more detail and partially cut away. In FIG. 3c, braid 216 can be seen to lie flat against top cap 214 for good thermal contact. A thermoelectric cooler designated generally as 310 includes an upper thermal bus 312 which bears against the inside of cap 214 and a lower thermal bus 314 which bears against the surface to be cooled. Semiconductor material 316 coupled between buses 312 and 314 pumps heat from bus 314 towards bus 312 when electrically energized with direct current, in known fashion. A transparent window 320 is mounted to allow light to reach the photosensitive portion of the imager (not visible in FIG. 3).

Figure 4:
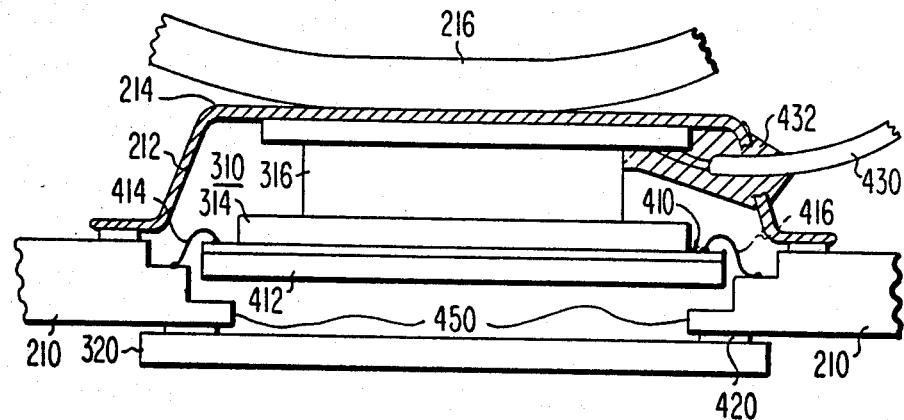

FIG. 4 is a cross-sectional view corresponding to FIG. 3b, in which the relationship of the imager chip to the cooler and window can be seen. In FIG. 4, a thinned imager chip 410 bonded to a thin glass plate 412 is thermally bonded to cooled thermal bus 314 and electrically connected by a number of bonding wires (two of which are shown as 414, 416) to pins 220 (not shown in FIG. 4). Window 320 is affixed to body 210 by means of adhesive gasket material illustrated as 420 so as to cover window opening 450 to form a sealed cavity in which the imager is mounted. It will be noted that there is no mechanical contact between glass plate 412 and body 210, and the only connection between thinned imager 410 and body 210 is by means of bonding wires 414, 416, etc. Since the bonding wires are extremely small in diameter and relatively long in relation to their diameter, they have significant thermal resistance. As a result, the thermal resistance between imager 410 and window 320 or body 210 is quite high, whereas the thermal resistance between imager 410 and cooled thermal bus 314 is very low. Window 320 is offset relative to the center of imager 410 so as to allow light to fall onto the "A" register, which is the register which has been selected for light sensing. Also visible in FIG. 4 is an electrical conductor cable 430 which passes through a hole in cap 212 to carry electrical energizing current to thermoelectric cooler 310. The hole through which cable 430 passes is sealed with epoxy illustrated as 432.

Figure 5:
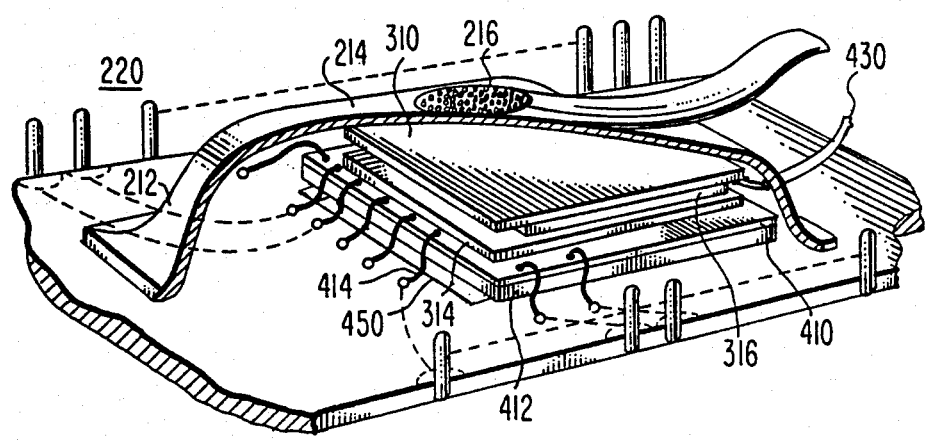

FIG. 5 illustrates the general structure in cutaway fashion as an aid to understanding the structure of the invention.

Figure 6:
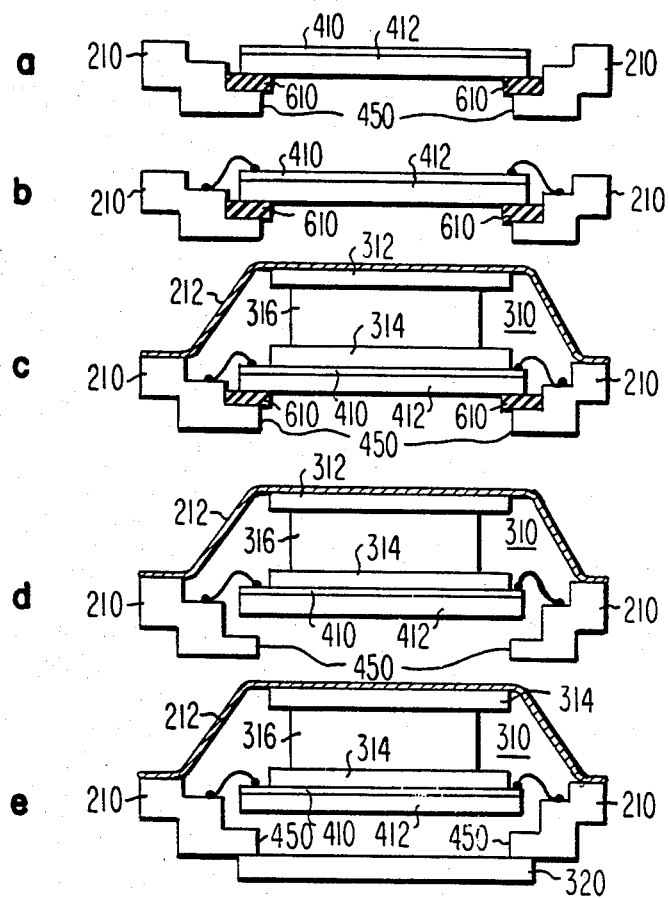
FIG. 6 illustrates in cutaway view the sequence of assembly of the cooled imager.

FIG. 6 illustrates the assembly procedure by which the structure illustrated in FIG. 4 is manufactured. In FIG. 6a, thinned imager 410 bonded to glass plate 412 is set onto a resilient gasket 610 sitting on a ledge of mount 210. The imager is thinned to improve blue sensitivity and to reduce thermal resistance between the rear surface of the imager and the photosensitive surface facing glass plate 412. FIG. 6b illustrates the bonding of wires between appropriate points of imager 410 and corresponding contacts on mount 210. FIG. 6c illustrates the bonding of a cap 212 with thermoelectric cooler 310 to the structure of FIG. 6b in such a fashion that thermal bus 314 presses against imager 410 which therefore presses glass plate 412 so as to somewhat compress gasket 610. FIG. 6d illustrates the result of removing gasket 610 by pulling it through window opening 450. FIG. 6e illustrates the structure with window 320 affixed in position over opening 450.

Dry gas is used to fill the cavity formed between the cap and the window in which the imager resides. The lack of moisture in the gas prevents precipitation onto the imager or glass plate when they are cooled. It is desirable to use a gas having low thermal conductivity, so as to increase the thermal resistance between imager 410 and window 320. Gases having low thermal conductivity are well known, and the fluorocarbon known commercially as Freon is suitable. The gas may be introduced into the cavity after mounting of the window 320 by evacuation and refilling through a small hole in the cap, or the window may be affixed while the assembly is immersed in a gas atmosphere.

Figure 7:
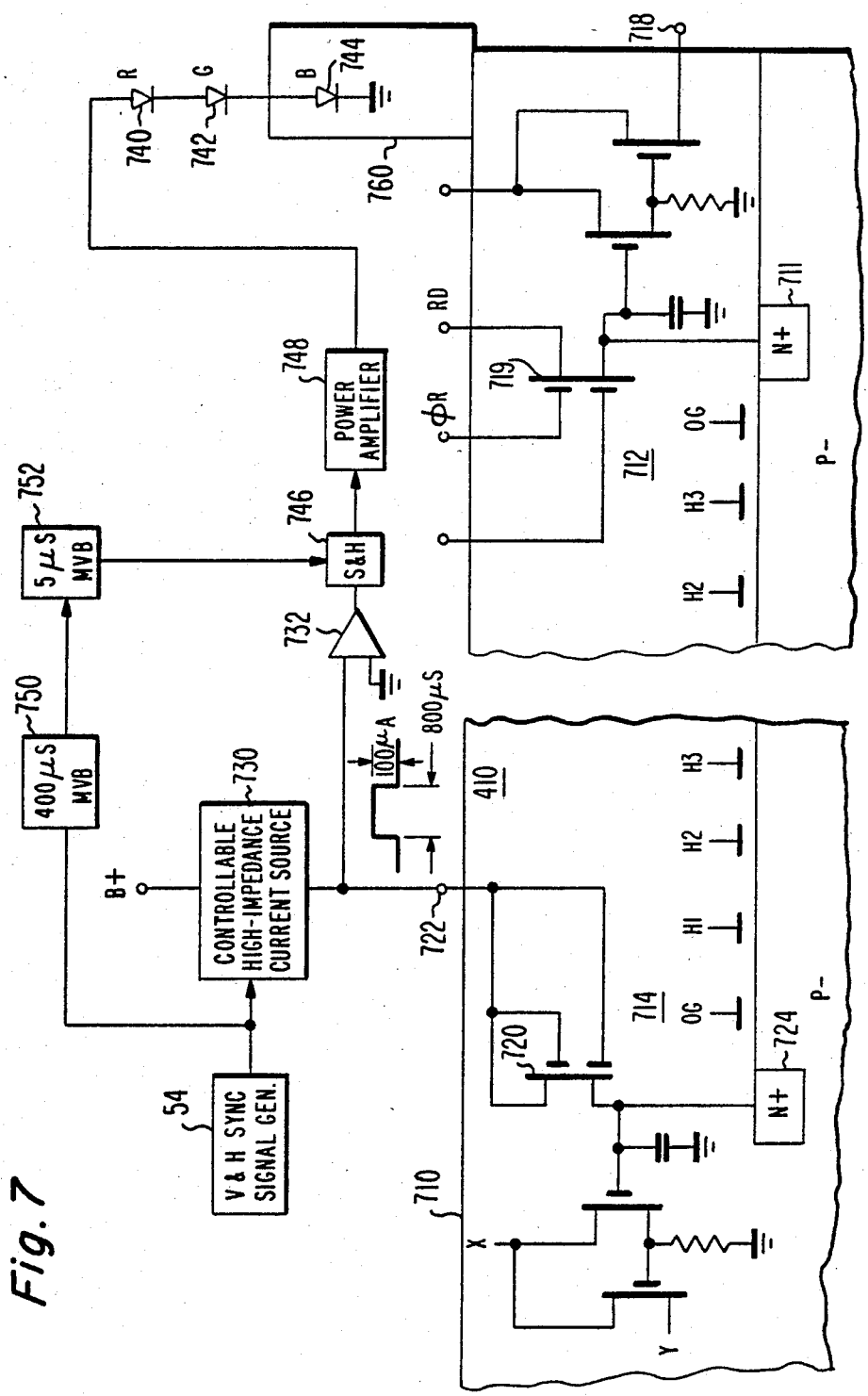
FIG. 7 is a block diagram of the thermal servo by which the temperature is controlled.

FIG. 7 illustrates in block-diagram form the control and drive circuits of another embodiment of a thermal servo for a color television camera. In FIG. 7, connections in a portion of the output "C" register of a frame-transfer imager and the output amplifier region are illustrated in a region bounded by a surface 710. The various gates of a CCD imager are labeled OG, H1, H2, and H3. These gates are driven by the polyphase clock signals from generator 22 of FIG. 1 for causing signal-representative charges in "wells" in the p-region to travel towards an output diode region, illustrated as the junction between a region N+ and the p-region. The gate connections are not illustrated in detailed fashion because they are well known and are not central to the invention. At the right end of the C register is an output amplifier designated generally as 712 and at the left of the C register is an output amplifier designated generally as 714. The images are made with two output amplifiers so that signals may be clocked in either direction by adjustment of the phasing of the drive clocks to reverse the image right-to-left for special effects or for compensating for the effects of a mirror in the light path. Ordinarily, only one output amplifier is used and the other one is not bonded for connection to the outside world. In the arrangement of FIG. 7, the signal output is taken from output amplifier 712 to which the various clock signals are applied for transferring signal from diode 711 to an output terminal 718 for further processing. Several connections of output amplifier 714 are not bonded during the bonding operation, as indicated by an "X". During the bonding operation, the gates of a dual-gate field-effect transistor (FET) 720 of output amplifier 714 are coupled together and to the drain. This forms a junction diode between an output terminal 722 and the N+ region 724. The junction diode formed from FET 720 is thermally coupled to imager 410 and tends to remain at either the same temperature as the remainder of the chip or at a fixed offset temperature relative thereto. Consequently, otherwise-unused diode-connected FET 720 may be used to sense the temperature of the imager chip to aid in the operation of a temperature-control thermal feedback loop or servo. Naturally, if output amplifier 714 is used for signal handling, FET 719 of amplifier 712 would be bonded as a junction diode for temperature sensing.

Since a junction diode produces no significant voltage in the absence of a current passing therethrough, production of a temperature-dependent sense voltage requires that a current be passed through temperature-sensing diode 720. However, it has been discovered that a current flow through diode-connected FET 720 perturbs the generation of light-representative charge in the photosensitive regions of the imager. It has further been discovered, however, that injection of current into the diode does not perturb transfer of charge from the photosensitive regions to the output registers. Terminal 722 is therefore connected to a controllable high impedance current source 730 coupled to a source B+ of supply for gating current from B+ to diode-connected FET 720 during the pull-down interval of the imager. Source 730 is controlled by sync signal from sync signal generator 54 so as to conduct for an interval of approximately 800 microseconds during vertical blanking, which corresponds generally with the pull-down interval. Sufficient current must flow to produce an adequate sense voltage, but not so much as to significantly raise the temperature of the diode above that of the surrounding chip. It has been found that a current of approximately 100 $\mu$A is adequate in this regard. When the specified current flows in the diode, a voltage which depends upon temperature appears between terminal 722 and ground, and is compared with a reference voltage by a comparator or amplifier 732. In FIG. 7, comparator 732 compares the sense voltage with ground.

During the integrating interval following each pull-down interval, the sense voltage drops to zero because current source 730 is turned off. Consequently, the error voltage produced by comparator 732 becomes zero. If the error voltage were used to directly control the thermoelectric coolers illustrated as 740-744, the coolers would be energized with a low duty cycle (800 microseconds per each 16,600 microseconds television field interval=0.048), and higher peak cooler drive currents would be required to maintain proper operating temperature. Such high peak currents are disadvantageous, especially for portable cameras which must be powered from batteries. In order to maintain low peak cooler drive current, a sample-and-hold (S&H) circuit illustrated as 746 is coupled to the output of comparator 732 and is gated during the pull-down interval to store the error voltage throughout the next following integrating interval for operating power amplifier 748 for driving thermoelectric coolers 740-744 with a constant current. A gate pulse for S&H 746 may be generated by a circuit consisting of a cascade of a 400-microsecond monostable multivibrator 750 coupled to an output of sync generator 54 for being triggered into its active condition at the beginning of the pull-down interval and for producing a pulse 400 $\mu$S after the beginning of the pull-down interval, which pulse triggers a 5 $\mu$S monostable multivibrator 752 for triggering S&H 746.

Thermoelectric cooler 744 as illustrated is located within a box 760 which represents a thermal coupling between cooler 744 and imager 410 associated with the blue light output port of the color light splitting prism (not shown) of the television camera. Thus, the thermal servo loop controls the temperature of imager 410, which is coupled to receive the blue components of light from the image being televised. Since the thermal resistances of the red and green imagers to their surroundings are approximately equal to the thermal resistances associated with the blue imager, application of equal cooling drive will result in similar temperatures. Consequently, thermoelectric coolers 740 and 742 associated with the red- and green-responsive imagers respectively are electrically coupled in series with cooler 744. The series electrical connection is advantageous because of the relatively low electrical resistance of the thermoelectric coolers. For coolers having higher impedance, a parallel or series-parallel electrical connection may be more advantageous, as will be obvious to those skilled in the art.

Other embodiments of the invention will be obvious to those skilled in the art. For example, the cooled imager may be green- or luminance-responsive and an uncooled single imager having a color checkerboard or stripe filter may be used to respond to red and blue in known fashion. Also, a single checkerboard-filter-imager responsive to red and blue may be open-circuit cooled by a thermal servo controlling the green chip temperature. The resilient gasket 610 shown in FIG. 6 may be made of paraffin or other substance which may be removed by melting, rather than by pulling, or the gasket may be of a soluble substance which is removed by a noncorrosive solvent. The temperature-sensing element may be a diode formed as such within the imager chip, or it may be an element other than a diode, as for example a resistor, which has a more linear temperature-resistance characteristic than a diode. Further, the temperature-sensing element may be external to the imager chip, and clamped to sense the temperature; however such an external sensor is disadvantageous in that it requires further assembly and also because it tends to be less sensitive to changes in the chip temperature.

What is claimed is:
1. A thermal servo for a television camera, comprising:
a solid-state imager responsive to clock signals and including a photosensitive surface responsive to incident light from a scene for generating output signals representative of said scene;
synchronizing means coupled for controlling said clock signals applied to said imager such that said photosensitive surface develops integrated incident light signals during recurrent field intervals and transfers said integrated incident light signals out of said photosensitive surface during recurrent transfer intervals as said output signals of said imager;
thermoelectric cooling means coupled to said imager for cooling said imager for reducing thermal noise in said output signals of said imager;
temperature sensing means coupled to said imager for developing a signal representative of the temperature of said imager during said recurrent transfer intervals;
drive means coupled to said thermoelectric cooling means and responsive to a temperature control signal for energizing said thermoelectric cooling means for closing a thermal servo loop for stabilizing the temperature of said imager; and
sample-and-hold means coupled between said temperature sensing means and said drive means and responsive to said signal representative of the temperature of said imager for developing said temperature control signal during said recurrent transfer intervals and for applying said temperature control signal to said drive means during said recurrent field intervals.

2. A servo according to claim 1, wherein said temperature sensing means comprises:
thermally-sensitive resistance means thermally coupled with said imager;
a current source electrically coupled with said resistance means for generating a temperature-indicating voltage during said recurrent transfer intervals;
a source of reference voltage; and
comparator means for generating as said signal representative of the temperature of said imager a signal representative of the difference between said temperature-indicating and reference voltages.

3. A thermal servo for a television camera, comprising:
a solid-state television imager responsive to clock signals and including a photosensitive surface responsive to incident visible light for developing an image-representative output signal representative of said incident visible light;
thermoelectric cooling means coupled to said imager for cooling said imager for reducing thermal noise in the image-representative output signal of said imager;
thermally-sensitive resistance means thermally coupled with said imager;
a current source electrically coupled with said resistance means for generating a temperature-indicating voltage;
a reference voltage source;
comparator means for generating at an output a signal representative of the difference between said temperature-indicating and reference voltages;
drive means coupled to said comparator means output and to said thermoelectric cooling means for energizing said thermoelectric cooling means for closing a thermal servo loop for stabilizing the temperature of said imager;

synchronizing means coupled for controlling the clock signals applied to said imager such that said imager develops said image-representative output signal representative of said incident light during sequential integrating intervals which are interleaved between signal transfer intervals; and control means coupled to said current source and to said synchronizing means for decoupling said current source from said resistance means during said integrating intervals, for opening said thermal servo loop during said integrating intervals for preventing injected current from perturbing the generation of said image-representative output signal.

4. A servo according to claim 3 further comprising a sample-and-hold circuit for sampling said comparator means output signal during said transfer intervals and for maintaining connection of said sampled signal to said drive means during said integrating intervals.

* * * * *